United States Patent
Clark et al.

(10) Patent No.: US 6,867,956 B2
(45) Date of Patent: Mar. 15, 2005

(54) ELECTROSTATIC DISCHARGE PROTECTION DEVICE AND METHOD THEREFOR

(75) Inventors: Lawrence T. Clark, Phoenix, AZ (US); Pradeep Elamanchili, Chandler, AZ (US); Timothy J. Maloney, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 475 days.

(21) Appl. No.: 09/746,675

(22) Filed: Dec. 22, 2000

(65) Prior Publication Data

US 2002/0080536 A1 Jun. 27, 2002

(51) Int. Cl.[7] .................................................. H02H 9/00
(52) U.S. Cl. ........................................................ 361/56
(58) Field of Search ............................................ 361/56

(56) References Cited

U.S. PATENT DOCUMENTS

| | | | | |
|---|---|---|---|---|
| 5,461,338 A | * | 10/1995 | Hirayama et al. | 327/534 |
| 5,907,464 A | * | 5/1999 | Maloney et al. | 361/111 |
| 6,163,044 A | * | 12/2000 | Manning | 257/299 |
| 6,329,874 B1 | | 12/2001 | Ye et al. | 327/544 |

* cited by examiner

*Primary Examiner*—Brian Sircus
*Assistant Examiner*—James A Demakis
(74) *Attorney, Agent, or Firm*—Blakely, Sokoloff, Taylor & Zafman LLP

(57) ABSTRACT

Briefly, in accordance with one embodiment of the invention, an integrated circuit comprises a charge protection device that is reverse body biased when the integrated circuit is in normal operation.

13 Claims, 4 Drawing Sheets

ELECTROSTATIC DISCHARGE PROTECTION DEVICE AND METHOD THEREFOR

BACKGROUND

One technique to protect the components (e.g., transistors, inactive devices, etc) of an integrated circuit from an electrostatic discharge (ESD) event is to add circuitry intended to sink or remove the charge associated with the ESD event. For example, a wide clamping device (e.g. a transistor having a width significant to allow the charge to drain away without creating a damaging current density) may be placed in parallel or in series with the portion of the integrated circuit to be protected. Due to the width of the clamping device, it is typically able to sink the charge associated with the ESD device and alleviate high voltage levels that may otherwise result.

However, as manufacturing techniques improve, the channel length of transistors is typically reduced, which, in turn, may increase the sub-threshold leakage of the transistors. Consequently, the clamping devices may become a significant source of leakage current while the integrated circuit is in operation. Thus, there is a continuing need for better ways to provide charge protection to an integrated circuit that have reduced leakage currents.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
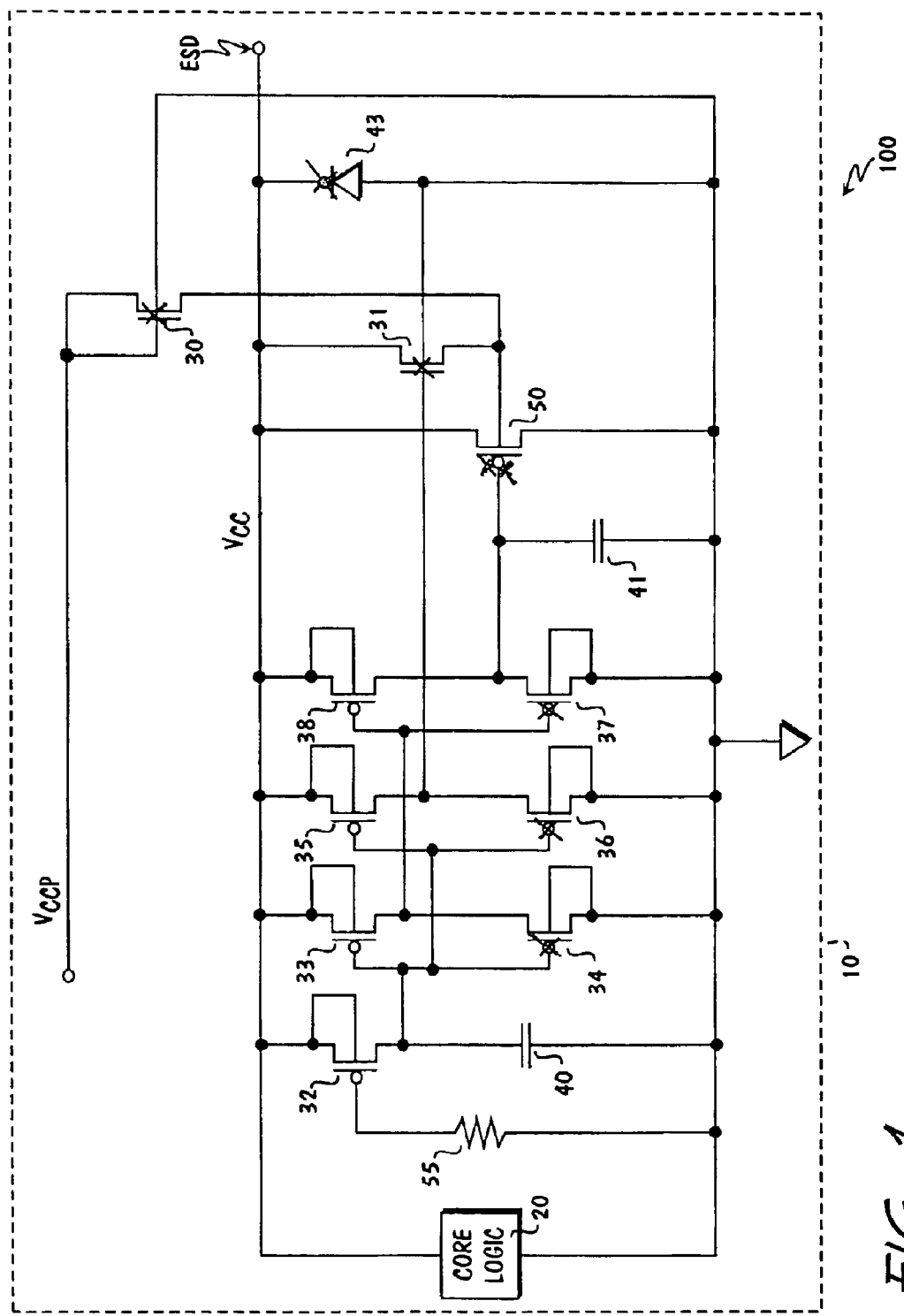
FIG. 1 is a schematic representation of a portion of an integrated circuit having a charge protection device in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Turning to FIG. 1, an embodiment 100 in accordance with the present invention is described. Embodiment 100 may comprise a portable device such as a mobile communication device (e.g., cell phone), a two-way radio communication system, a one-way pager, a two-way pager, a personal communication system (PCS), a portable computer, or the like. Although it should be understood that the scope and application of the present invention is in no way limited to these examples.

Embodiment 100 here includes an integrated circuit 10 that may comprise, for example, a microprocessor, a digital signal processor, a microcontroller, or the like. However, it should be understood that only a portion of integrated circuit 10 is included in FIG. 1 and that the scope of the present invention is not limited to these examples. Integrated circuit 10 may comprise core logic 20 that may include transistors that perform the instructions or operations executed by integrated circuit 10.

Although the scope of the present invention is not limited in this respect, integrated circuit 10 may be coupled to a power supply voltage potential, labeled Vcc in FIG. 1. For example, Vcc may range from about 0.5–2.5 volts above ground. As shown in FIG. 1, the power supply voltage potential may be provided from an external pin upon which an electrostatic discharge event may occur. An electrostatic discharge event may be caused by a variety of situations depending upon the environment in which integrated circuit 10 is placed. Simply stated, although the scope of the present invention is not limited in this respect, an electrostatic discharge (ESD) event may occur when excess charge is present on the pin used to provide the power supply voltage potential. This may occur if integrated circuit 10 comes in electrical contact with something having excess charge (e.g., physical contact by a human being or a piece of manufacturing equipment).

To reduce the likelihood that the excessive charge may damage the active or inactive components of core logic 20, integrated circuit 10 may comprise a charge protection device that is used to provide a low impedance path that provides a path for the excessive charge to ground. For example, integrated circuit 10 may comprise a p-channel Metal-oxide Semiconductor (PMOS) device 50 that is capable of sinking the excess charge associated with an ESD event.

Although the scope of the present invention is not limited in this respect, transistor 50 may be manufactured so that it provides a path for the excessive charge to ground that is of lower impedance than the transistors and components of core logic 20. The physical dimensions of transistor 50 may vary depending on the manufacturing technology used and the electrical characteristics of the transistors in core logic 20. For example, transistor 50 may have a width of at least 500 microns and a channel length of less than about 0.2 microns, although the scope of the present invention is not limited in this respect. It should be understood the physical and electrical characteristics of transistor 50 may be altered so that transistor 50 is capable of carrying a desired amount of pulsed current. In this particular embodiment, transistor 50 may be able to conduct at least 1 amp or more depending on factors such as its width. In alternative embodiments, transistor 50 may be capable of conducting a pulsed 5–10 amps without any adverse effects.

Integrated circuit 10 may optionally comprise a PMOS transistor 32, a capacitor 40, and a resistive element 55 that may be used to enable the charge protection device during an ESD device. Excess charge on the power supply voltage potential source, Vcc, may cause transistor 32 to conduct, which, in turn will place a voltage potential on capacitor 40.

Integrated circuit 10 may also optionally comprise timer or delay units that may be used to enable the operation of clamping transistor 50 and a biasing transistor 31. For example, transistors 35–36 may act as an inverter that enables biasing transistor 31 if there is a voltage potential stored on capacitor 40 (e.g., during an ESD event). Transistors 33–34 and 37–38 may act as two inverters in series that enable the operation of clamping transistor 50. However, clamping transistor 50 may be substantially enabled after biasing transistor 31 due to the extra inverter in the path of the enabling signal. As explained in more detail below, biasing transistor 31 may be desirable so to offset or compensate the reverse biasing of clamping transistor 50 that may occur while under normal operation (e.g. performing its intended operations such as executing instructions, storing data, processing data, etc.). This may allow transistor 50 to conduct more current during an ESD event.

Integrated circuit 10 may also comprise a resistive element 30 that may be used to reverse bias the charge protection device, clamping transistor 50. As shown in FIG. 1, resistive element 30 may be a n-channel Metal-oxide Semiconductor (NMOS) transistor whose gate terminal and drain region are coupled to a voltage potential, labeled Vccp. Although the scope of the present invention is not limited in this respect, Vccp may be higher or greater than the power supply voltage potential, Vcc. As should be apparent, in the embodiment shown in FIG. 1, transistor 30 is in a source follower arrangement, although, again, the scope of the present invention is not limited in this respect.

While integrated circuit 10 is in normal operation (e.g. embodiment 100 is in use and/or there is no ESD event), resistive element 30 may provide a voltage potential (e.g. approximately Vccp) to the bulk region of clamping transistor 50. This, in turn, may reverse bias clamping transistor 50 since the source region of clamping transistor 50 is at a lower voltage potential (e.g., Vcc). If the charge protection device (e.g. clamping transistor 50) is an enhancement-mode PMOS device, the bulk region may refer to the portion of the semiconductor substrate in which a conductive channel is formed when a low voltage potential (e.g., 0 volts or ground) is applied to the gate terminal. By applying a voltage potential to the bulk region of transistor 50 that is higher than the voltage potential on the source region of transistor 50, the transistor may be reverse body biased so that the leakage current through transistor 50 when it is in a non-conducting or disabled state is reduced. This, in turn, may reduce the overall power consumption of integrated circuit 10.

When integrated circuit experiences an ESO event (e.g. excess charge is present on the power supply voltage potential line, capacitor 40 and the inverter provided by transistors 35–36 may enable biasing transistor. For example, the excessive charge may, at least in part, result in a high voltage potential on the gate terminal of biasing transistor 31. This, in turn, may cause biasing transistor 3, to conduct so that the power supply voltage potential, Voc, may be applied to the bulk region of clamping transistor 50. This may be desirable to offset or compensate for the reverse biasing effect provided by resistive element 30 so that clamping transistor 50 may have a lower threshold voltage. Consequently, the charge protection device may provide a path to ground for the excessive charge that has lower impedance than the devices in core logic 20. Consequently, the charge may be dissipated without causing any damage to core logic 20.

It should be understood that resistive element 30 need not be a NMOS transistor in order to reverse bias the charge protection device. In alternative embodiments, resistive element may comprise two or more transistors in series.

Likewise, resistive element 30 may comprise a thick-gate transistor that has a gate oxide that is thicker than the components or transistors of core logic 20, or comprise a diffused or polysilicon resistor. Simply speaking, it may be desirable for resistive element 30 to have an impedance value greater than transistor 31 to reduce the effects of reverse biasing, although the scope of the present invention is not limited in this respect.

Figure 2:
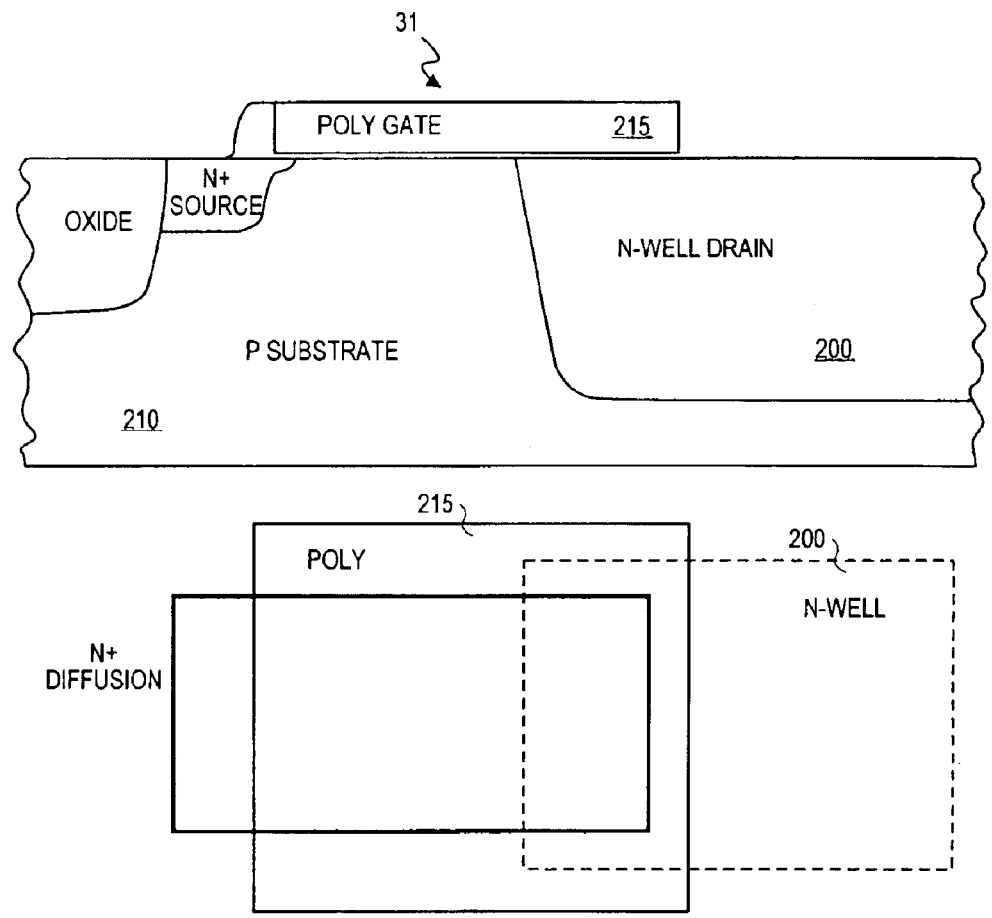
FIG. 2 is a cross-sectional and top view of a portion of a charge protection device in accordance with an embodiment of the present invention.

FIG. 2 is provided to illustrate an example of the dense arrangement of biasing transistor 31, although the scope of the present invention is not limited to this particular example. It should be understood that in alternative embodiments, the transistors shown in the figures may have opposite polarity (e.g., n-channel devices instead of p-channel devices, etc.) and the scope of the present invention is not limited to a particular substrate material as alternatives such as semiconductor-on-insulator (SOI) may also be used.

FIG. 2 illustrates a cross-sectional view of biasing transistor along with a corresponding top view of the layout structure. Biasing transistor 31 may be formed in a p substrate 210 and include a gate structure 215 that partially overlaps both p substrate 210 and an n-well region 200. Optionally, the charge protection device, such as clamping transistor 50 may also be formed in n-well region 200 to reduce the amount of interconnect use to couple biasing transistor 31 to clamping transistor 50. This arrangement may protect the gate of transistor 21 from the substantially higher voltage potential on its drain node.

Figure 3:
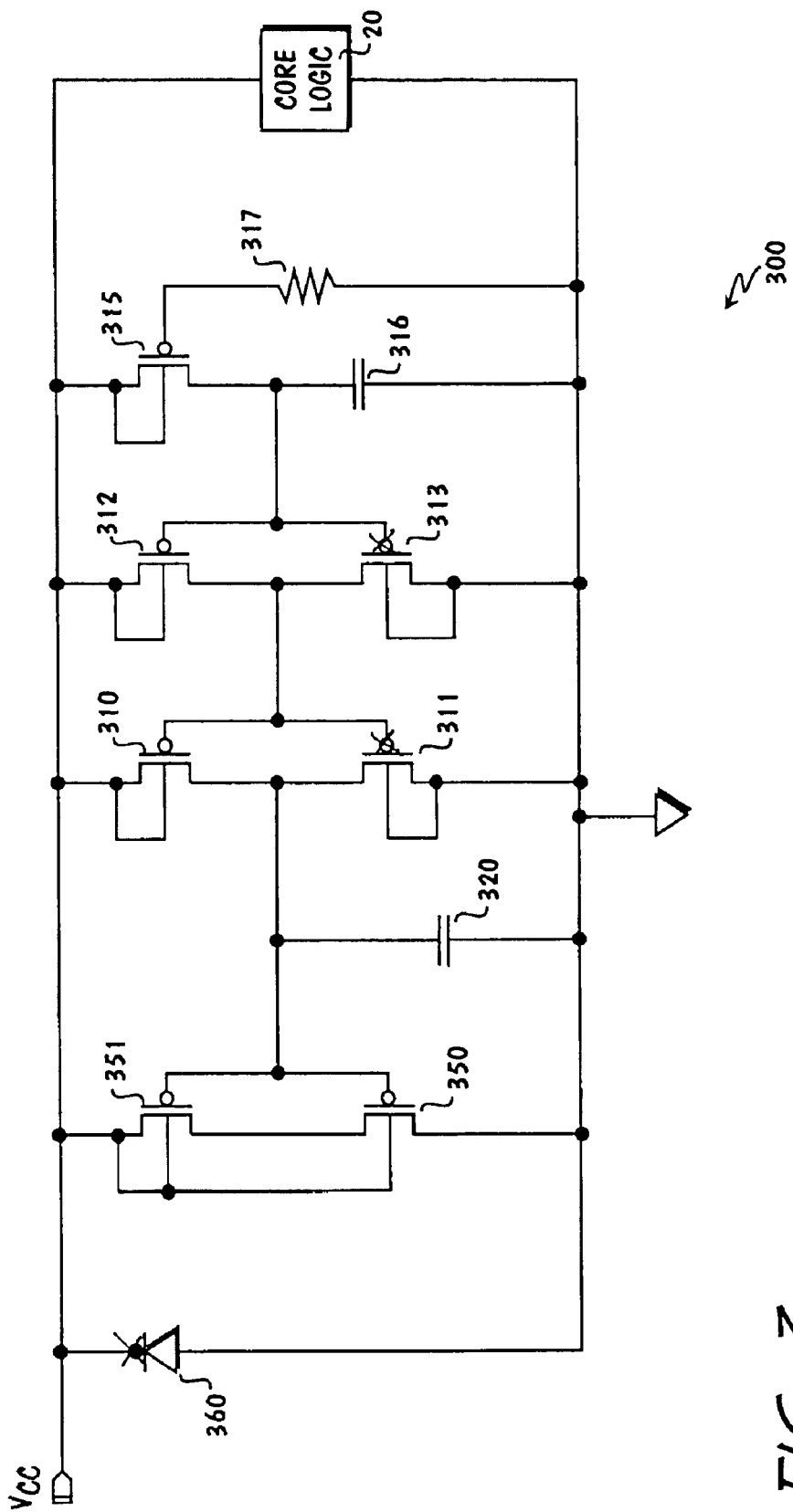
FIGS. 3–4 are schematic representations of alternative embodiments of the present invention.

Turning to FIG. 3, an alterative embodiment 300 of a charge protection device for core logic 20 is provided. In this particular embodiment, more than one transistor may be used to provide the low impedance path to ground for excessive charge on the power supply voltage potential, Vcc. For example, transistors 350–351 are in series and may provide a path to excessive charge so that the components and transistors of core logic 20 are not damaged during an ESD event.

During an ESD event, the excessive charge on the power supply voltage line may cause transistor 315 to conduct so that a logic "0" is stored on capacitor 316. This may indicate that an ESD event is occurring. Transistors 310–312 may provide two inverters in series which may have the effect of enabling transistors 350–351 so that a low impedance path to ground may be provided. As indicated in FIG. 3, the source region of transistor 351 and the bulk region of transistors 350–351 are connected to the power supply voltage potential, Vcc. However, the source terminal of transistor 350 is not connected to Vcc, but rather the drain of transistor 351. Consequently, when the transistors of core logic 20 are in operation, and there is no ESD event, transistors 350–351 are disabled. The source voltage potential of transistor 350 may be at a lower voltage potential than the bulk region of transistor 350. This, in turn, may cause transistor 350 to be reverse body biased.

Reverse body bias on one of the transistors of the charge protection device (e.g., transistor 350) may reduce the leakage current through transistor 350. Since transistor 351 is in series with transistor 350, the leakage current through transistor 351 may be reduced the same or similar amount. Having multiple transistors in series to provide the charge protection device may be desirable because the combination of transistors in series may allow the charge protection device to protect for ESD events on nodes with higher voltage potentials (e.g., input/output voltages).

Figure 4:
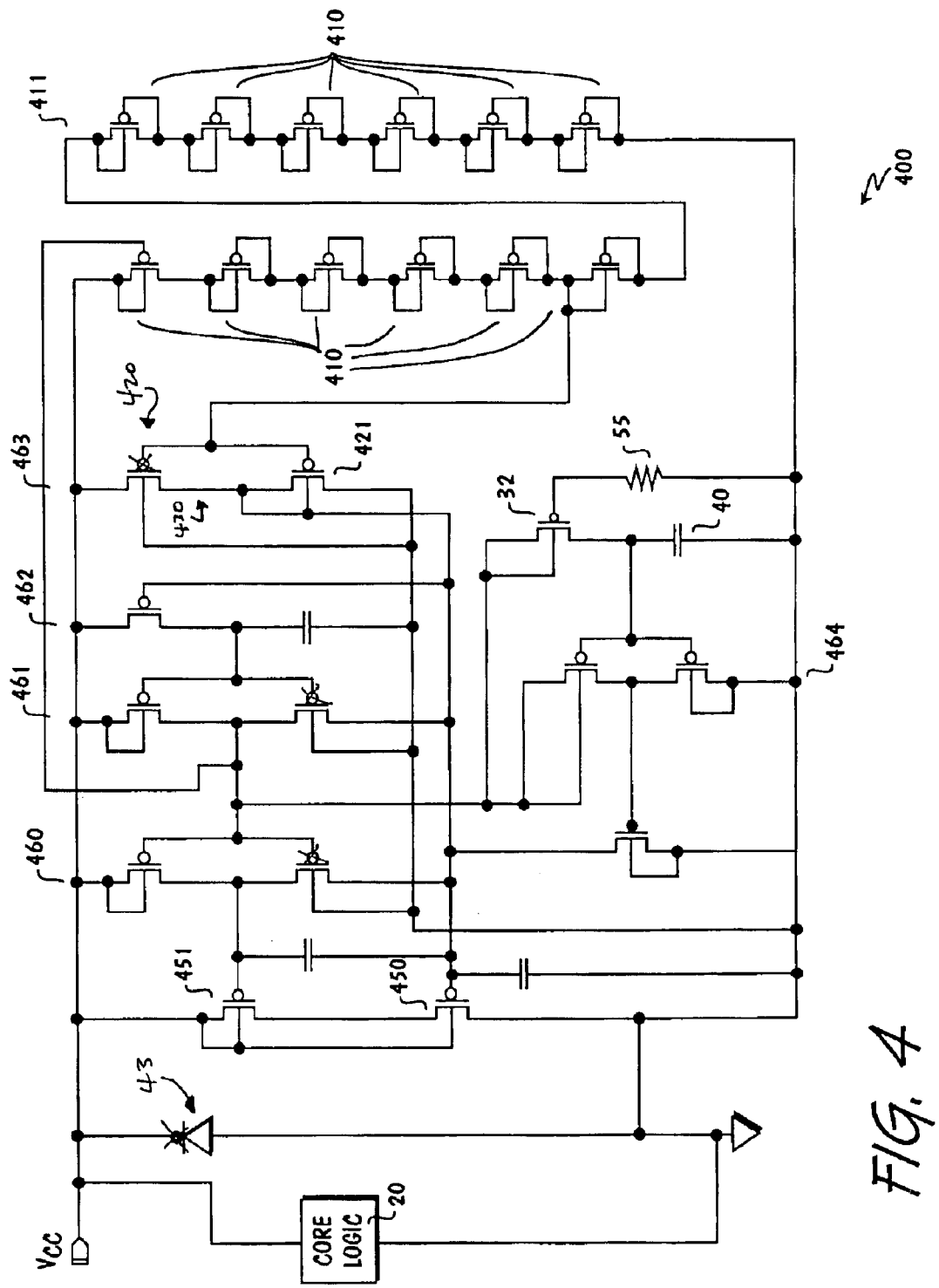

As discussed with reference to FIG. 3, it may be desirable to provide a charge protection device by placing two or more clamping transistors in series between the power supply voltage potential (e.g., Vcc and ground). As indicated in FIG. 3, the gate terminal of transistors are enabled by the same signal or voltage potential. Referring now to FIG. 4, in some alternative embodiments, it may be desirable for the transistors that provide the charge protection device to have different threshold voltages or to be enabled by different signals or voltage potentials.

As shown in FIG. 4, a plurality of transistors 410 may be used to provide a voltage divider 411. Voltage divider 411 may be used to provide an output voltage potential that is a fraction of the power supply voltage potential, Vcc. The output voltage potential may be provided to a voltage buffer 430. Voltage buffer 430 may be provided with transistors 420–421 and may be used to amplify or drive a voltage potential to the gate terminal of clamping transistor 450. This particular embodiment may also comprise inverters 460–464 that may be use to delay or time when clamping transistors 450–451 are enabled so that they may provide a low impedance path for excessive charge during an ESD event. As shown in FIG. 4, the source terminal of transistor 450 may float while the bulk region of transistor 450 is connected to the power supply voltage potential. Consequently, transistor 450 may be reverse body biased when there is no ESD event. It should be understood that it may be desirable, in alternative embodiments, to remove transistor 32. resistor 55, and capacitor 40 in an effort to reduce the size of the overall circuit. Although the scope of the present invention is not limited in this respect, some embodiments may include a diode (e.g. diode 360 of FIG. 3 or diode 43 of FIG. 4). a capacitor (e.a. capacitor 320 of FIG. 3 or capacitor 41 of FIG. 4, and/or a resistor (e.g. resistor 317 of FIG. 3).

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A method for reducing the leakage current through a charge protection device in an integrated circuit, the method comprising:
   supplying a bulk region of the charge protection device with a first voltage potential through a first device when the integrated circuit is in operation; and
   supplying the bulk region with a second voltage potential through a second device when the integrated circuit experiences an electro-static discharge (ESD) event.

2. method of claim 1, wherein supplying a bulk region of the charge protection device with a first voltage potential includes reverse body biasing the charge protection device when the integrated circuit is not experiencing an electro-static discharge event.

3. The method of claim 1, wherein supplying a bulk region of the charge protection device with a first voltage potential further comprises:
   applying the first voltage potential to the bulk region of the charge protection device that is higher than the second voltage potential.

4. An apparatus comprising:
   an integrated circuit;
   a charge protection device coupled to the integrated circuit;
   a resistive element to supply a reverse bias to a bulk region of the charge protection device during normal operation of the integrated circuit; and
   another device to supply the bulk region with a voltage potential that compensates the reverse bias when the integrated circuit receives an electro-static discharge (ESD) event.

5. The apparatus of claim 4, wherein the charge protection device comprises a first transistor having a source region and the bulk region, the resistive element being coupled to the bulk region of the transistor.

6. The apparatus of claim 5, wherein the first transistor comprises a p-channel transistor.

7. The apparatus of claim 4, wherein the resistive element comprises an n-channel transistor.

8. The apparatus of claim 4, wherein the integrated circuit comprises a logic transistor having a gate oxide, and the resistive element comprises a transistor having a gate oxide that is thicker than the gate oxide of the logic transistor.

9. The apparatus of claim 5, wherein the first transistor has a width of at least 500 microns, a channel length of less than about 0.2 microns, and is adapted to conduct at least 1 pulsed amp.

10. An apparatus comprising:
    an integrated circuit;
    a charge protection device coupled to the integrated circuit, the charge protection device comprising a first transistor and a second transistor, wherein the first transistor and the second transistor are arranged in series;
    a buffer having an output coupled to a gate terminal of the first transistor;
    a resistive element having a control terminal coupled to the output of the buffer and providing a signal to a gate terminal of the second transistor; and
    a voltage divider includes serially connected transistors to supply a voltage potential to an input of the buffer.

11. An apparatus comprising:
    a first transistor coupled between a positive power conductor and a ground power conductor to provide charge protection for an integrated circuit;
    a resistive element coupled to provide a bulk region of the first transistor with a voltage potential that is greater than a voltage potential supplied on the positive power conductor; and
    a second transistor to couple the voltage potential supplied on the positive power conductor to the bulk region of the first transistor when the integrated circuit experiences an electro-static discharge (ESD) event.

12. The apparatus of claim 11, wherein the resistive element comprises a third transistor.

13. The apparatus of claim 11, wherein the resistive element comprises a third transistor that has a gate oxide that is thicker than a gate oxide of the first transistor.

* * * * *

UNITED STATES PATENT AND TRADEMARK OFFICE
CERTIFICATE OF CORRECTION

PATENT NO.     : 6,867,956 B2
DATED          : March 15, 2005
INVENTOR(S)    : Clark et al.

It is certified that error appears in the above-identified patent and that said Letters Patent is hereby corrected as shown below:

Column 3,
Line 59, delete "ESO" and insert -- ESD --.
Line 65, delete "3," and insert -- 31 --.
Line 66, delete "$V_{oc}$" and insert -- $V_{cc}$ --.

Column 5,
Line 63, before "method", insert -- The --.

Signed and Sealed this

Thirty-first Day of May, 2005

JON W. DUDAS
*Director of the United States Patent and Trademark Office*